United States Patent [19]
Bandyopadhyay et al.

[11] Patent Number: 6,130,467
[45] Date of Patent: Oct. 10, 2000

[54] SHALLOW TRENCH ISOLATION WITH SPACERS FOR IMPROVED GATE OXIDE QUALITY

[75] Inventors: Basab Bandyopadhyay, Austin, Tex.; Nick Kepler, Saratoga, Calif.; Olov Karlsson; Larry Wang, both of San Jose, Calif.; Effiong Ibok, Sunnyvale, Calif.; Christopher F. Lyons, Fremont, Calif.

[73] Assignee: Advanced Micro Devices, Inc., Sunnyvale, Calif.

[21] Appl. No.: 08/993,857

[22] Filed: Dec. 18, 1997

[51] Int. Cl.[7] .................................... H01L 29/00

[52] U.S. Cl. .......................... 257/506; 257/513

[58] Field of Search .................. 257/506, 513, 257/900

[56] References Cited

U.S. PATENT DOCUMENTS

| | | | |
|---|---|---|---|
| 4,729,002 | 3/1988 | Yamazahi | 257/900 |
| 5,433,794 | 7/1995 | Fazan et al. | 257/506 |
| 5,436,488 | 7/1995 | Poon et al. | 257/513 |
| 5,868,870 | 2/1999 | Fazan et al. | 257/513 |

*Primary Examiner*—Mark V. Prenty

[57] ABSTRACT

An insulated trench isolation structure is formed in a semiconductor substrate with an oxide or nitride spacer overlying and protecting a portion of a pad oxide layer at the trench edge such that the pad oxide layer acts as part of the gate oxide layer. Embodiments include providing a step between the trench fill and the pad oxide layer and forming the protective spacer thereon. The protective spacer protects the underlying portion of the pad oxide layer at the trench edge during pad oxide removal prior to forming a gate oxide. Therefore, it is only necessary to grow the gate oxide on the main surface of the substrate, not at the trench edges. The gate oxide can then be formed uniformly thin, while the remaining pad oxide at the trench edges is relatively thick.

2 Claims, 4 Drawing Sheets

SHALLOW TRENCH ISOLATION WITH SPACERS FOR IMPROVED GATE OXIDE QUALITY

FIELD OF THE INVENTION

The present invention relates to a method of manufacturing a semiconductor device comprising trench isolation. The invention has particular applicability in manufacturing high density semiconductor devices with submicron design features and active regions isolated by shallow insulated trenches.

BACKGROUND ART

Current demands for high density and performance associated with ultra large scale integration require submicron features of about 0.25 microns and under, increased transistor and circuit speeds and improved reliability. Such demands for increased density, performance and reliability require formation of device features with high precision and uniformity.

Conventional semiconductor devices comprise a substrate and various electrically isolated regions, called active regions, in which individual circuit components are formed. The electrical isolation of these active regions is typically accomplished by thermal oxidation of the semiconductor substrate, typically monocrystalline silicon or an epitaxial layer formed thereon, bounding the active regions.

One type of isolation structure is known as trench isolation, wherein shallow trenches are etched in the substrate and an oxide liner is thermally grown on the trench walls. The trench is then refilled with an insulating material. The resulting structure is referred to as a shallow trench isolation (STI) structure. The active region typically comprises source/drain regions formed in the semiconductor substrate by implantation of impurities, spaced apart by a channel region on which a gate electrode is formed with a gate oxide layer therebetween. The gate electrode controls the turn-on and turn-off of each transistor. The quality and thickness of the gate oxide are crucial to the performance of the finished device.

A typical method of trench formation comprises initially growing a pad oxide layer on the substrate, and depositing a nitride layer thereon. A photoresist mask is then applied to define the trench areas. The exposed portions of the nitride layer are then etched away, followed by the pad oxide layer. The etching continues into the substrate to form the shallow trench. When etching of the trench is completed, the photoresist is stripped off the nitride layer.

Next, the substrate is oxidized to form an oxide liner on the walls and base of the trench to control the silicon-silicon dioxide interface quality. The trench is then refilled with an insulating material (or "trench fill"), such as silicon dioxide derived from tetraethyl orthosilicate (TEOS). The surface is then planarized, as by chemical-mechanical polishing (CMP) using the nitride layer as a polish stop. In subsequent operations, the nitride and pad oxide are stripped off, and a gate oxide layer is grown on the exposed silicon of the substrate.

Disadvantageously, the gate oxide layer typically does not grow uniformly. It tends to be thinner at the trench edges, because the gate oxide growth rate is smaller there due to the varying crystallographic orientation of the substrate material at the trench edges; that is, the gate oxide grows at a decreased rate at the trench edges because the silicon at the trench edges has a different crystallographic orientation than the main surface of the substrate. The thinness of the gate oxide at the trench edges increases the electric field strength at the trench edges, which can cause a breakdown of the gate oxide, thereby decreasing device reliability.

There exists a continuing need for shallow trench isolation methodology wherein the resulting gate oxide layer at the trench edges exhibits high reliability.

SUMMARY OF THE INVENTION

An object of the present invention is a method of manufacturing a semiconductor device having a shallow trench isolation region and a gate oxide with high integrity.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device having an insulated trench formed in a semiconductor substrate or in an epitaxial layer on the semiconductor substrate, which method comprises: forming a pad oxide layer on a main surface of the substrate or epitaxial layer; forming a nitride layer having an upper surface on the pad oxide layer; providing a mask having an opening on the nitride layer; etching to remove portions of the underlying nitride and pad oxide layers and to form a trench in the substrate or epitaxial layer, which trench comprises side surfaces intersecting the main surface at edges; forming an oxide layer lining the trench, on the edges, and in contact with the pad oxide layer; depositing an insulating material to fill the trench and cover the nitride layer; planarizing such that an upper surface of the insulating material is substantially flush with the upper surface of the nitride layer; removing the nitride layer, thereby forming a step between the insulating material and the pad oxide layer, the step defined by a substantially vertical side surface of the insulating material; depositing a protective layer on and different from the insulating material and on the pad oxide layer; and anisotropically etching the protective layer to form a protective sidewall spacer on the side surfaces of the insulating material and extending on the pad oxide layer.

Another aspect of the present invention is a method of manufacturing an integrated circuit, comprising: forming a silicon oxide pad layer having a thickness of about 100 Å to about 200 Å on a main surface of the substrate or an epitaxial layer formed on the substrate; forming a silicon nitride layer having an upper surface on the silicon oxide pad layer; providing a photoresist mask having an opening on the silicon nitride layer; etching to remove portions of the underlying silicon nitride layer and silicon oxide pad layer and to form a trench in substrate or epitaxial layer, which trench has side surfaces intersecting the main surface at edges; thermally growing a thin silicon oxide layer lining the trench, on the edges and in contact with the pad oxide; depositing an insulating material to fill the trench and cover the silicon nitride layer, the insulating material comprising silicon dioxide derived from tetraethyl orthosilicate (TEOS) by low pressure chemical vapor deposition (LPCVD), silicon dioxide derived from silane by LPCVD, or a high density plasma oxide; planarizing by chemical-mechanical polishing such that an upper surface of the insulating material is substantially flush with the upper surface of the nitride layer; removing the silicon nitride layer, thereby forming a step between the insulating material and the silicon oxide pad layer, the step defined by a substantially vertical side surface of the insulating material having a height of about 625 Å to about 1250 Å; depositing a protective layer of silicon nitride or silicon dioxide derived from tetraethyl orthosilicate (TEOS) by low pressure chemical vapor deposition (LPCVD) to cover the insulating material and the silicon oxide pad layer; anisotropically etching the protective layer to form a protective sidewall spacer on the side surfaces of the insulating material and extending on the silicon oxide pad layer, the protective sidewall spacer having a width of about 500 Å to about 1000 Å; removing portions of the silicon oxide pad layer not covered by the protective sidewall spacer; and growing a gate oxide layer having a thickness of about 40Å to about 50 Å on the main surface, wherein the protective layer comprises a material different from the insulating material.

A still further aspect of the invention is a semiconductor device comprising: a substrate or epitaxial layer formed in the substrate; a trench, formed in the substrate or epitaxial layer, having side surfaces intersecting a main surface of the substrate or epitaxial layer at edges; a thermally grown oxide liner in the trench and on the edges; a pad oxide layer on the main surface having one end in contact with the oxide liner and another end with a side surface; an insulating material filling the trench and extending above the trench to form a step between the insulating material and the pad oxide layer, the step defined by a substantially vertical side surface of the insulating material; and a protective sidewall spacer on the side surface of the insulating material and extending on the pad oxide layer.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

The present invention addresses and solves problems stemming from a characteristic reduction in the thickness of a gate oxide at the trench edges attendant upon conventional STI methodology. As a result, the quality of the gate oxide decreases with an attendant increase in the electric field strength at the trench edges, leading to early breakdown of the gate oxide, thereby decreasing the lifetime of the semiconductor device. The present invention addresses and solves such problems by enabling the manufacture of a semiconductor device having a thick gate oxide at the trench edges.

According to the methodology of an embodiment of the present invention, a photoresist mask is formed on a nitride layer which, in turn, is formed on a pad oxide layer on a main surface of a semiconductor substrate or an epitaxial layer on a semiconductor substrate. As used throughout the present disclosure and claims, the term "substrate" denotes a semiconductor substrate or an epitaxial layer formed on the semiconductor substrate.

After masking, the substrate is etched to form a trench intersecting the substrate surface at edges. An oxide liner is grown in the trench surface and on the edges in contact with the pad oxide. The trench is then refilled with an insulating material. The insulating material is planarized, as by CMP, and the nitride layer is removed, leaving a step between the insulating material and the pad oxide. A protective layer comprising a material different from the insulating material, such as silicon oxide or silicon nitride, is then deposited over the insulating material and the pad oxide layer. The protective layer is then anisotropically etched to form protective sidewall spacers strategically placed over the trench edges and on the pad oxide layer at the step abutting the insulating material. The portion of the pad oxide layer not protected by the protective spacer is then removed, leaving a portion of the pad oxide under the spacer at the trench edge. A gate oxide is subsequently grown on the main surface of the substrate. However, as the gate oxide layer does not need be grown at the trench edges occupied by the protected relatively thick pad oxide layer under the protective sidewall spacers, it can be grown relatively thin without fear of degradation at the edges. The remaining portion of the pad oxide under the protective sidewall spacers at the edges function effectively as part of the gate oxide layer.

Since the inventive methodology preserves the thick pad oxide grown at the trench edge by providing a protective sidewall spacer thereon, the gate oxide needs only to be grown on the substantially planar main surface of the substrate, which has a single crystallographic orientation. Thus, the gate oxide grows uniformly on the main surface, and is thick at the trench edges, avoiding the breakdown problems of conventional STI formation techniques attendant upon a reduction in thickness at the edges.

Figure 1A:
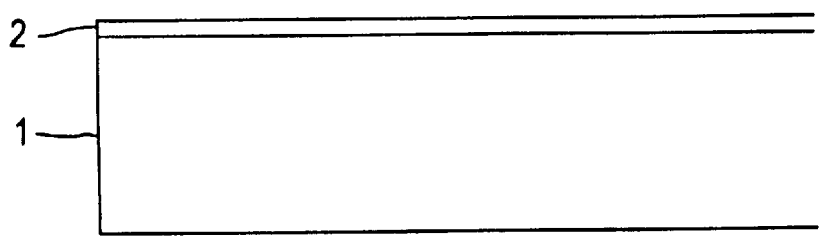
FIGS. 1A–1K schematically illustrate sequential phases of a method in accordance with an embodiment of the present invention.

An embodiment of the present invention is illustrated in FIGS. 1A–1K, illustrating sequential phases in forming a semiconductor device in accordance with the present invention. Referring to FIG. 1A, a substrate 1 is prepared having a substantially planar surface, typically a semiconductor substrate comprising doped monocrystalline silicon or an epitaxial layer formed on a semiconductor substrate in accordance with conventional practices. A pad oxide layer 2 having a thickness of about 100 Å to about 200 Å is then grown on the substrate 1. Pad oxide layer 2 typically comprises silicon oxide and can be thermally grown on the substrate or deposited by chemical vapor deposition (CVD). In another embodiment, a pad oxide containing a thinned thermally-grown silicon oxide layer and a buffer polycrystalline silicon layer is employed as the pad layer.

Figure 1B:
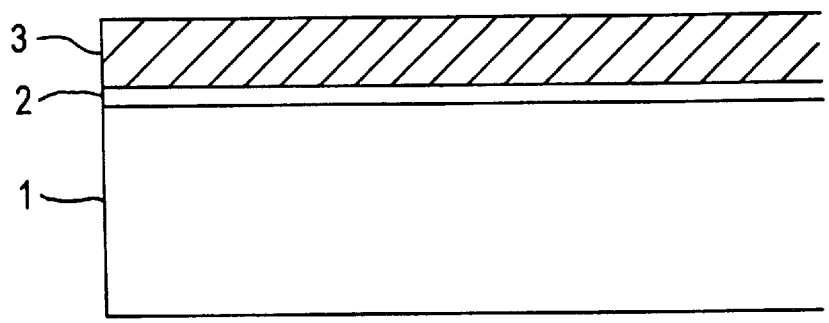

After formation of the pad oxide layer 2, a nitride layer 3 is deposited on the pad oxide layer 2, as shown in FIG. 1B, such as a silicon nitride layer by CVD. Silicon oxide pad layer 2 functions as a buffer layer cushioning stresses between substrate 1 and nitride layer 3. Nitride layer 3 functions as an oxidation mask as it is resistant to the diffusion of oxygen and water vapor therethrough, thereby preventing an oxidizing species from reaching the underlying silicon substrate, and also acts as a polish stop.

Figure 1C:
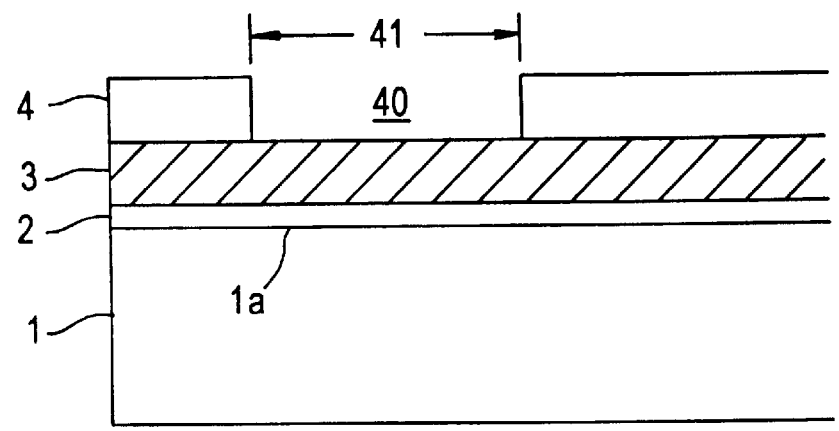
Figure 1D:
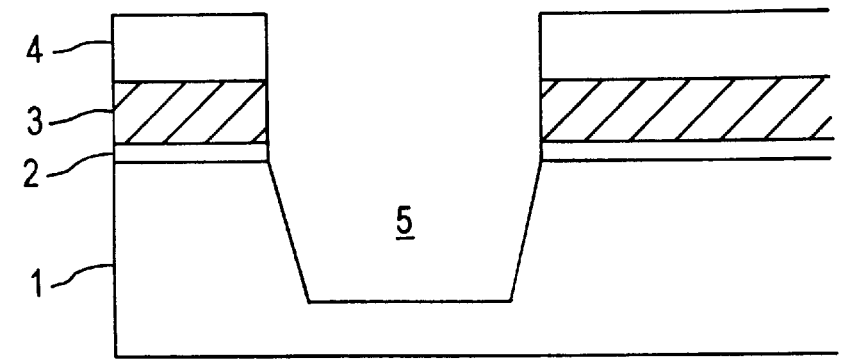

A photoresist mask 4 is then formed on nitride layer 3, as shown in FIG. 1C. Photoresist mask 4 has a pattern defined by openings 40, which have a width 41 substantially corresponding to the width of the subsequently formed trench at the main surface 1a of the substrate 1, such as about 0.25 µ or less. The nitride layer 3 is then etched away, and the etching continues through the pad oxide layer 2 and into the substrate 1 to form the shallow trench 5, as shown in FIG. 1D. The trench 5 is typically etched to a depth of less than about 4000 Å. When the etching of the trench 5 is completed, the photoresist 4 is stripped off the nitride layer 3.

Figure 1E:
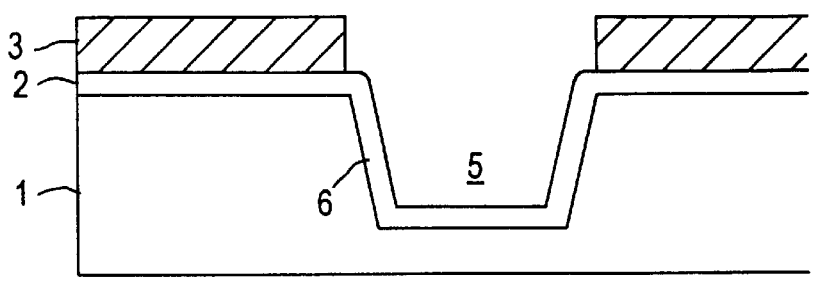
Figure 1F:
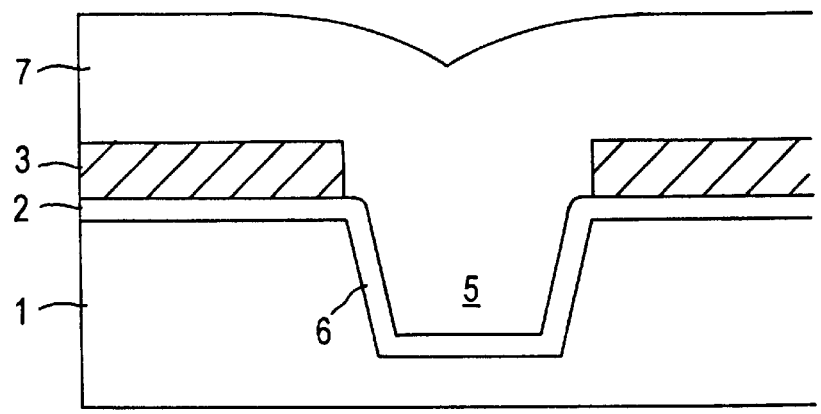
Figure 1G:
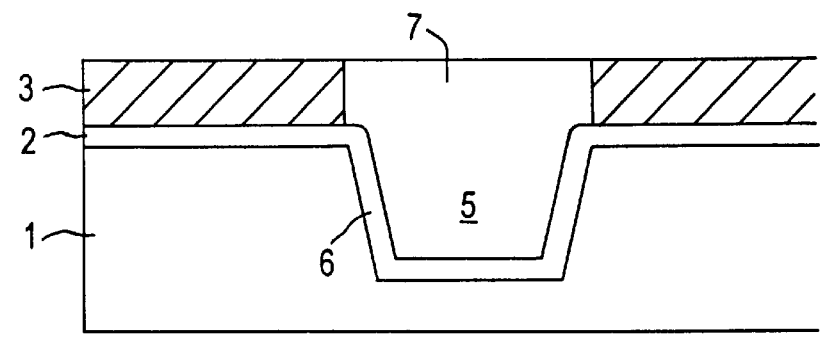
Figure 1H:
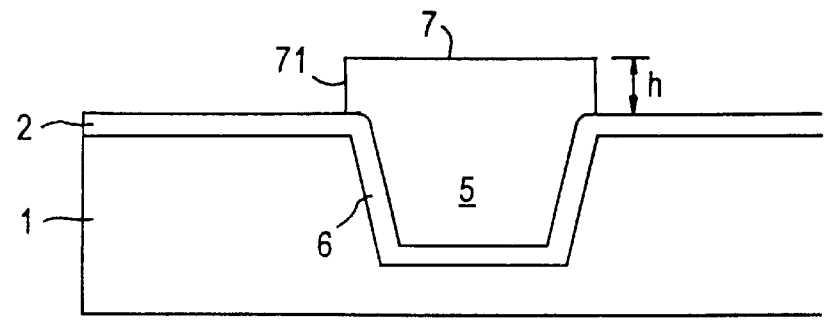

Thereafter, the trench surface is thermally oxidized to form an oxide liner 6 on the inner surface of trench 5, typically at a temperature of about 1000° C. or higher. FIG. 1E shows the trench 5 with the completed liner 6. Subsequent to formation of the oxide liner 6, trench 5 is filled with a suitable insulating material 7, as shown in FIG. 1F. Such insulating material can comprise silicon dioxide derived from TEOS by LPCVD or derived from silane by LPCVD. The trench 5 can also be filled with a high density plasma (HDP) oxide, preferably employing the methodology disclosed in copending application Ser. No. 08/924,133, filed Sep. 5, 1997, the entire disclosure of which is hereby incorporated herein by reference. Subsequent to trench filling, planarization is effected, such as by CMP, as shown in FIG. 1G. The nitride layer 3 is then stripped off, leaving the STI structure shown in FIG. 1H, thereby forming a step between the insulating material 7 and the pad oxide layer 2. The step is defined by a substantially vertical side surface 71 of the insulating material 7, which has a height h.

Figure 1I:
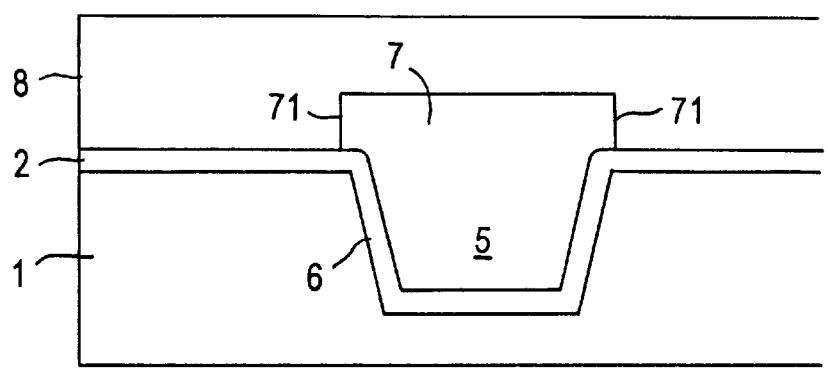
Figure 1J:
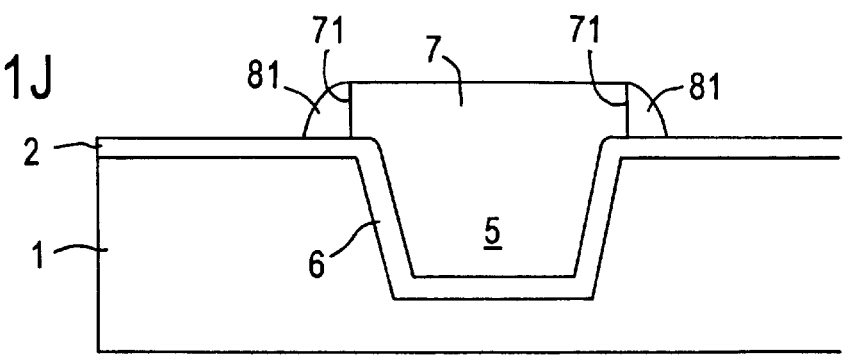
Figure 1K:
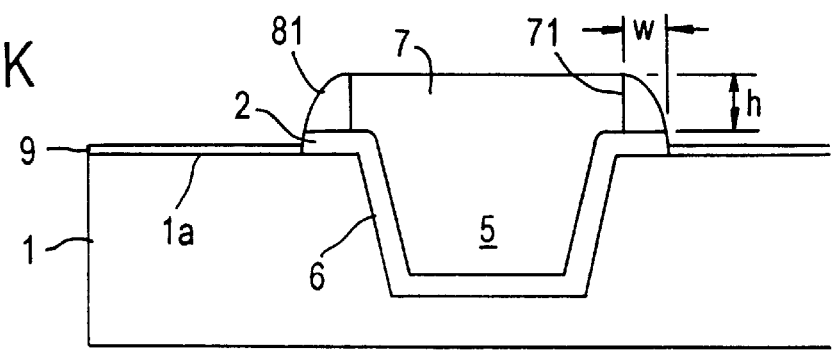

Next, as illustrated in FIG. 1I, a protective layer 8 is deposited to cover the insulating material 7 and the pad oxide layer 2. The protective layer 8 preferably comprises silicon dioxide derived from TEOS by LPCVD or derived from silane by LPCVD, or can comprise silicon nitride by CVD. The protective layer 8 is anisotropically etched to form protective sidewall spacer 81 on the side surface 71 of the insulating material 7 and extending on a portion of the pad oxide layer 2 proximate the trench edges, as shown in FIG. 1J.

Subsequent to the formation of protective sidewall spacer 81, impurities are implanted in the substrate 1 to form doped implants. Such implants can be field implants or channel implants, which include the sub-steps of depositing and etching a photoresist mask that defines the n-channel and p-channel regions. A sacrificial oxide may be grown at this stage as well, to relieve stress at the trench edges by rounding the edges and remove imperfections in the silicon of the main surface 1a of the substrate 1 before growing the gate oxide layer. The pad oxide 2 and the sacrificial oxide are removed from the substrate 1 by etching with dilute hydroflouric acid (HF) to leave clean, pure or fresh silicon at the main surface 1a of the substrate 1. A gate oxide 9 having a thickness of about 40 Å to about 50 521 is then grown on the main surface 1a, yielding the structure depicted in FIG. 1K. Since the gate oxide 9 is grown only on the flat main surface 1a, which has a single crystallographic orientation, the gate oxide 9 grows uniformly, and the remaining thick pad oxide 2 under the protective sidewall spacer 81 functions effectively as part of the gate oxide layer at the trench edge.

In practicing the present invention, the width w of protective sidewall spacer 81 is preferably about 500 Å to about 1000 Å, to assure that the entirety of the trench edge is covered, and to compensate for any erosion of the protective sidewall spacer 81 which may result from post-formation cleaning and etching processes, such as the HF cleaning step. Due to the nature of the anisotropic etching process, spacer width w is about 80% of the deposited thickness of the protective layer 8.

Figure 2:
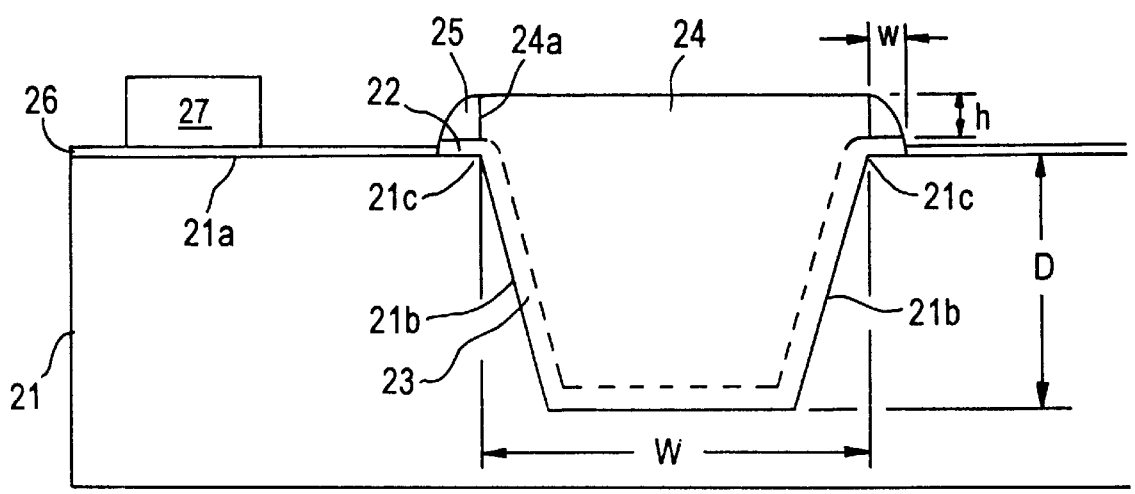
FIG. 2 is a cross-sectional view of a semiconductor device according to the present invention.

An embodiment of a semiconductor device in accordance with the present invention is described with reference to FIG. 2. The semiconductor device comprises a trench formed in a substrate 21 or in an epitaxial layer formed in substrate 21, the trench having side surfaces 21b intersecting the main surface 21a of the substrate 21 at trench edges 21c. A silicon dioxide pad layer 22 having a thickness of about 100 Å to about 200 Å (e.g., 150 Å) is disposed on the trench edges 21c and main surface 21a. A silicon dioxide liner 23 is thermally grown in the trench. An insulating material 24, such as silicon dioxide, fills the trench and extends above the trench to form a step between the insulating material 24 and the silicon dioxide pad layer 22, the step characterized by a substantially vertical side surface 24a of the insulating material 24. A protective sidewall spacer 25, such as silicon dioxide or silicon nitride, is disposed on the side surface 24a of the insulating material 24 and extends on silicon dioxide pad layer 22. A gate oxide layer 26 having a thickness of about 40 Å to about 50 Å covers the main surface 21a. A gate electrode 27 is disposed on the gate oxide layer 26.

The trench typically has a width W at the main surface 21a of about 0.25 Å or less, and a depth D of less than about 4000 Å. The height h of the side surface 24a is typically about 500 Å to about 1250 Å, and the width w of the protective sidewall spacer 5 is typically about 500 Å to about 1000 Å.

The trench isolation formed in accordance with the present invention is characterized by gate oxide layers at the trench edges which are not thinned, but are relatively thick and exhibit high quality, with an attendant reduction in the electric field between the gate electrode and the substrate at the trench edges, thereby avoiding potential breakdown of the gate oxide and device failure. The present invention is applicable to the manufacture of various types of semiconductor devices having STI, particularly high density semiconductor devices having a design rule of about 0.25 µ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A semiconductor device comprising:
   a substrate or epitaxial layer formed in the substrate;
   a trench, formed in the substrate or epitaxial layer, having side surfaces intersecting a main surface of the substrate or epitaxial layer at edges;
   a thermally grown oxide liner in the trench and on the edges;
   a pad oxide layer on the main surface having one end in contact with the oxide liner and another end having a side surface, the pad oxide layer covering a first portion of the main surface having a varied crystallographic orientation and proximal to the trench edges;

an insulating material filling the trench and extending above the trench to form a step between the insulating material and the pad oxide layer, the step defined by a substantially vertical side surface of the insulating material, wherein the substantially vertical side surface of the insulating material has a height of 500 Å to about 1250 Å;

a protective sidewall spacer on the side surface of the insulating material and extending on the pad oxide layer, wherein the protective sidewall spacer has a width of about 500 Å to about 1000 Å; and a thin gate oxide layer on only a second portion of the main surface having a single crystallographic orientation.

2. A semiconductor device comprising:

a substrate or epitaxial layer formed in the substrate;

a trench, formed in the substrate or epitaxial layer, having side surfaces intersecting a main surface of the substrate or epitaxial layer at edges;

a thermally grown oxide liner in the trench and on the edges;

a pad oxide layer on the main surface having one end in contact with the oxide liner and another end having a side surface, the pad oxide layer covering a first portion of the main surface having a varied crystallographic orientation and proximal to the trench edges;

an insulating material filling the trench and extending above the trench to form a step between the insulating material and the pad oxide layer, the step defined by a substantially vertical side surface of the insulating material, said substantially vertical side surface having a height of 500 Å to about 1250 Å;

a protective sidewall spacer on the side surface of the insulating material and extending on the pad oxide layer; and a thin gate oxide layer on only a second portion of the main surface having a single crystallographic orientation.

* * * * *